(12) United States Patent
Santana, Jr. et al.

(10) Patent No.: US 7,272,010 B1
(45) Date of Patent: Sep. 18, 2007

(54) THERMALLY CONDUCTIVE INTEGRATED CIRCUIT MOUNTING STRUCTURES

(75) Inventors: Miguel Santana, Jr., Buda, TX (US); Michael Bruce, Austin, TX (US); Thomas Chu, Austin, TX (US); Rama R. Goruganthu, Austin, TX (US); Robert Powell, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 24 days.

(21) Appl. No.: 11/338,033

(22) Filed: Jan. 24, 2006

Related U.S. Application Data

(62) Division of application No. 10/231,560, filed on Aug. 30, 2002, now Pat. No. 6,994,584.

(51) Int. Cl.
*H05K 7/20* (2006.01)

(52) U.S. Cl. .................................. 361/720; 361/687

(58) Field of Classification Search ............... 361/720, 361/687, 719
See application file for complete search history.

(56) References Cited

U.S. PATENT DOCUMENTS

| | | | |
|---|---|---|---|
| 6,295,203 B1 | 9/2001 | Lo | 361/704 |
| 6,407,922 B1 | 6/2002 | Eckblad et al. | 361/704 |
| 6,500,024 B2 | 12/2002 | Hsu | 439/485 |
| 6,529,378 B2 | 3/2003 | Wong et al. | 361/704 |
| 6,626,684 B1 | 9/2003 | Stickler et al. | 439/87 |
| 6,856,016 B2 * | 2/2005 | Searls et al. | 257/720 |
| 6,891,724 B2 * | 5/2005 | De Lorenzo et al. | 361/704 |
| 6,965,513 B2 * | 11/2005 | Montgomery et al. | 361/687 |
| 7,084,507 B2 * | 8/2006 | Awano | 257/773 |
| 2003/0096104 A1 | 5/2003 | Tobita et al. | |
| 2003/0117770 A1 | 6/2003 | Montgomery et al. | |
| 2003/0150604 A1 | 8/2003 | Koning et al. | |

OTHER PUBLICATIONS

Simon M. Sze and K. M. Striny; VLSI Technology; 1998; pp. 566, 569, 571, 572, 579-583, 596-600.
Rao R. Tummula et al., Microelectronic Packaging Handbook-Semiconductor Packaging Part II; Jan. 1997; p. II-383.
Carbon Nanotechnologies, Inc.; Buckytube Properties & Uses; Aug. 2002; pp.: http://www.cnanotech.com/pages/buckytube_properties_uses/buckytube_properties/5-1-1_basic_structure.html http://www.cnanotech.com/pages/buckytube_properties_uses/buckytube_properties/5-1-3_thermal_conduct.html http://www.cnanotech.com/pages/buckytube_properties_uses/buckytube_properties/5-1-5_chemistry_manipulation.html http://www.cnanotech.com/pages/buckytube_properties_uses/buckytube_uses/5-2-6_thermal_materials.html.

* cited by examiner

*Primary Examiner*—Hae Moon Hyeon
(74) *Attorney, Agent, or Firm*—Timothy M. Honeycut

(57) ABSTRACT

Various devices for mounting circuit devices and methods of making the same are provided. In aspect, a device is provided that includes a member for holding an integrated circuit. The member contains a first plurality of carbon nanotubes to enhance the thermal conductivity thereof. At least one conductor member projects from the member. In another aspect, a method of fabricating an interface for an electronic component is provided that includes forming a member containing a first plurality of carbon nanotubes and forming at least one conductor on the member.

17 Claims, 5 Drawing Sheets

THERMALLY CONDUCTIVE INTEGRATED CIRCUIT MOUNTING STRUCTURES

This application is a divisional of Ser. No. 10/231,560, filed Aug. 30, 2002, now U.S. Pat. No. 6,994,584.

BACKGROUND OF THE INVENTION

1. Field of the Invention

This invention relates generally to semiconductor processing, and more particularly to apparatus for interfacing with integrated circuits and to methods of making the same.

2. Description of the Related Art

Many current integrated circuits consist of a chip or die enclosed within a package that is equipped with a plurality of connector pins for insertion into the socket of a circuit board. The die consists of a substrate composed of a semiconductor material such as silicon or germanium. One side of the substrate is provided with a plurality of circuit structures that makeup the integrated circuit and the other is left as relatively bare substrate material that is normally planarized via a polishing step.

Although packaging schemes for conventional integrated circuits are legion, many packages for individual die consist of mating halves of a ceramic or plastic material that are bonded together to form an enclosure. In some packaging schemes, the flat, non-circuit side of the die is secured to one half of the package and an electrical interconnections to the connector pins are made via a plurality of bonding wires soldered to bonding pads on the die and to portions of the connector pins. In other packaging schemes, the die is oriented in a so-called flip-chip fashion so that the die is oriented face down, that is, with the circuit structures of the integrated circuit facing downward and in contact with a plurality of minute solder bumps. The bumps are connected to the connector pins via bonding wires, metal traces, or the like. In still other packaging arrangements, multiple die are arranged in a multi-chip package and may be positioned in a flip-chip orientation or in other physical orientations.

As with most electrical devices, heat generation associated with processes such as $I^2R$ losses and capacitor charging and discharging presents challenges for the designer of die-based integrated circuits. Elevated chip operating temperatures impose constraints in several ways. To begin with, high operating temperatures restrict the types of materials that may be used to fabricate both the chip and the chip packaging. In addition, chip operating temperature has a direct impact on the maximum available switching speed and thus the overall speed performance of the integrated circuit. Furthermore, higher operating temperatures restrict the permissible operating voltage and ambient temperature environment of the chip. Lastly, chip life span is adversely impacted by higher operating temperatures. If the available mechanisms for integrated circuit heat dissipation cannot adequately handle the $I^2R$ heat propagation, compromises in the speed performance, the operating voltage, the applications and the design life span of the integrated circuit may have to be made.

In many conventional VLSI and ULSI circuit designs, engineers have turned to the use of heat sinks and forced convection in order to provide adequate cooling. A conductive heat transfer pathway is provided between the die and a heat sink that is coupled to the package. Many such conventional heat sinks consist of a plurality of metallic heat fins. The heat flow from the die to the die package is limited by the area of the die that is in contact with the package. In flip-chip packaging schemes, this contact surface area will normally be the area of the upward facing planar surface, that is, simply the area of the rectangular die. Since the contact area of the die is fixed, other means must be attempted to increase the heat flow therefrom, such as decreasing the temperature of the heat sink coupled to the package, either by increasing its size, by increasing the air flow across it to improve forced convective heat transfer, or by introducing a refrigerated fluid system to the package. Each of these solutions involves additional complexity and cost and may present space constraints on the placement of the integrated circuit in various products such as personal computers and other types of hardware.

The problems of heat dissipation are not limited to integrated circuit packaging. Indeed, various other structures used establish the requisite interfaces between integrated circuits and other devices form parts of the conductive heat transfer pathways to and from the integrated circuits. Two examples of these include circuit boards and sockets. Circuit boards provide a macro-level interface with devices, such as a computer. Various types of sockets are positioned on a typical circuit board to serve as plug-in sites for chips, other boards or devices. In both cases, the basic building material of the board or socket is generally electrically insulating and thus thermally resistive.

The present invention is directed to overcoming or reducing the effects of one or more of the foregoing disadvantages.

SUMMARY OF THE INVENTION

In accordance with one aspect of the present invention, a device is provided that includes a member for holding an integrated circuit. The member contains a first plurality of carbon nanotubes to enhance the thermal conductivity thereof. At least one conductor member projects from the member.

In accordance with another aspect of the present invention, a socket member for coupling to an electronic component is provided. The socket member includes a body that has a first plurality of carbon nanotubes and at least one socket to receive a conductor member of the electronic component.

In accordance with another aspect of the present invention, a circuit board is provided that includes a substrate that has a first plurality of carbon nanotubes and at least one conductor coupled to the substrate.

In accordance with another aspect of the present invention, a method of fabricating an interface for an electronic component is provided that includes forming a member containing a first plurality of carbon nanotubes and forming at least one conductor on the member.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
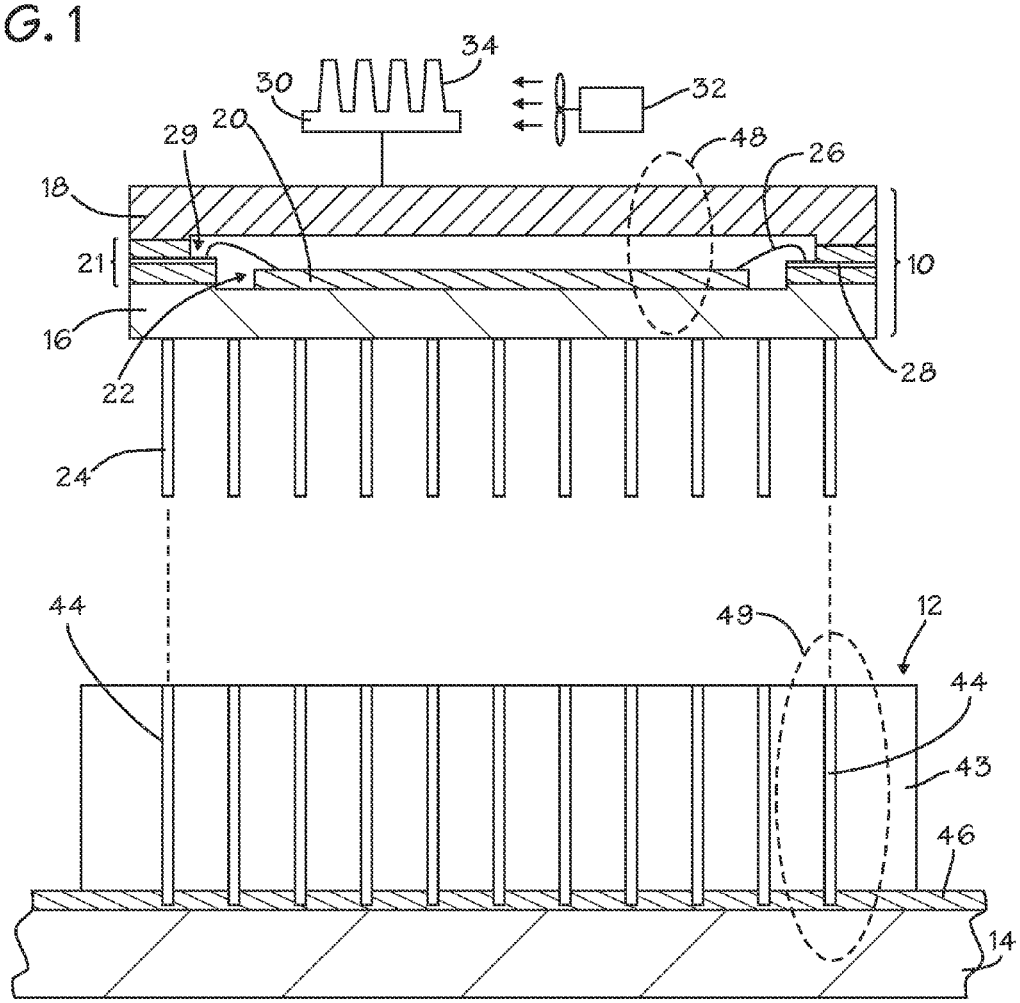
FIG. 1 is an exploded cross-sectional view of exemplary embodiments of an integrated circuit package, a socket assembly and a circuit board in accordance with the present invention.

In the drawings described below, reference numerals are generally repeated where identical elements appear in more than one figure. Turning now to the drawings, and in particular to FIG. 1, therein is shown an exploded cross-sectional view of exemplary embodiments of integrated circuit interface devices 10, 12 and 14. In this illustration, the integrated circuit interface devices 10, 12 and 14 consist of an integrated circuit package 10, a socket assembly 12 and a circuit board 14. However, the skilled artisan will appreciate that the benefits of the present invention may be realized in a myriad of interface devices.

The illustrative embodiment of the integrated circuit package 10 (hereinafter "package") is of a closed design, that is, consisting of a lower portion or base 16 and an upper portion or lid 18 that are mated together to form an enclosure for an integrated circuit 20. The lower portion 16 and the upper portion 18 are joined together by an adhesive 21. The adhesive 21 may be an epoxy, a sealing glass or the like. The lower portion 16 includes a recess 22 in which the integrated circuit 20 is positioned. One or more vertically projecting conductor members or pins 24 emanate from the base 16. The pins 24 are interconnected to the integrated circuit 20 by means of a plurality of bonding wires 26 and one or more lead frames or pads 28. While only a few conductor members 24 are depicted, there may be scores or even hundreds of them depending on the complexity of the integrated circuit 20.

The upper half 18 of the package 10 is provided with a recess 29 that corresponds to the general outline and shape of the corresponding recess 22 in the lower half 16. The package 10 may be provided with an external heat sink 30 that is coupled to the package 10 and represented schematically for simplicity of illustration. In addition, a cooling fan 32 may be provided to transfer heat away from the heat sink 30 by forced convection. The heat sink 30 will normally have a plurality of externally projecting heat fins 34.

The base 16 and the cover 18 may be composed of a variety of materials, such as, for example, epoxy-based plastics, ceramics or the like. Exemplary materials include, for example, polyimide, thermosetting epoxy-based plastics, polyurethane-based plastics, aluminum oxide-based ceramics or the like. However, and as described more fully below, the base 16 and the cover 18 may be provided with a quantity of carbon nanotubes to enhance the thermal conductivity and thus the heat dissipation properties of the package 10.

The socket member 12 includes a body 43 that is provided with a plurality of upwardly projecting conducting members or sockets 44 that are sized and arranged spatially to receive the conductor pins 24 of the package 10. The body 43 is therefore advantageously composed of an insulating material such as, for example, the same types of materials described elsewhere herein for use in the package 10. Note the socket member 12 may be optionally configured to receive another circuit board in lieu of an integrated circuit package.

The circuit board 14 may be configured as a printed circuit board, a wire-wrap, a breadboard card or virtually any other type of board design. A variety of well-known materials suitable for boards may be used to make the board 14, such as, for example, epoxy-bonded fiberglass, epoxy-based plastics, ceramics or the like.

The socket member 12 is mounted on the circuit board 14 using well-known fastening techniques, such as, for example, adhesives, screws, brackets or other well-known techniques. The electrical interconnections between the sockets 44 and the circuit board 14 are provided by one or more conductor members or traces, one of which is shown in section and designated 46. The sockets 44 are physically connected to the trace 46 by direct physical connection, soldering, or other well-known connection techniques. Of course, the board 14 may use various means of interconnection in addition to traces, such as front or backplane wire-wrap, ribbon-cable, lithographically patterned traces or the like.

The socket member 12 and the circuit board 14 provide another pathway for conductive heat transfer away from the integrated circuit 20. Like the components of the package 10, the socket member 12 and circuit board 14 may be provided with quantities of carbon nanotubes to enhance the thermal conductivity thereof.

Figure 2:
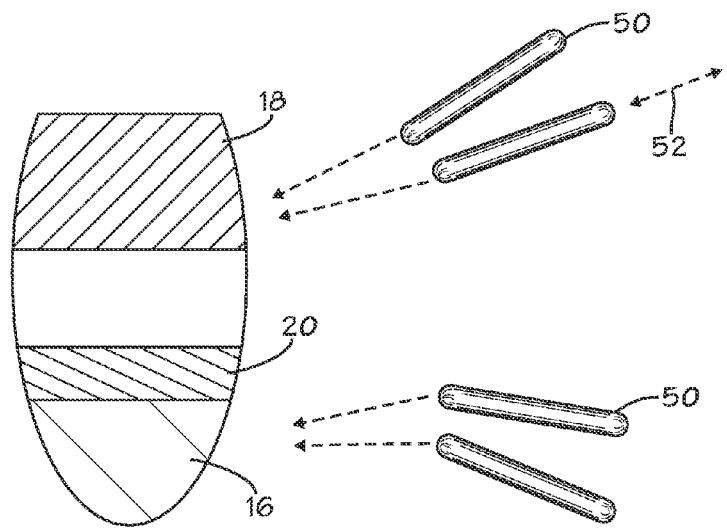
FIG. 2 is a magnified view of a selected portion of FIG. 1 that includes the integrated circuit package in accordance with the present invention.

A more detailed depiction of the package 10 is shown in FIG. 2, which is a magnified view of the portion of FIG. 1 circumscribed generally by the dashed oval 48. Another portion of FIG. 1 circumscribed by a dashed oval 49 is shown in a magnified view in FIG. 3 and will be described below. Because of the increased magnification of the view in FIG. 2, the bump 24 that is visible is shown in section. As mentioned above, various portions of the package 10 may be provided with quantities of carbon nanotubes 50. The carbon nanotubes 50 may be provided in the upper portion 18 of the package 10, the lower portion 16 of the package 10 or both. Note that the incorporation of the carbon nanotubes 50 in the various structures described is illustrated schematically by the dashed arrows.

The carbon nanotubes 50 may be advantageously added to the bulk material(s) or layers used to form the various portions of the package 10 at a stage of manufacture that is appropriate for the particular material or layer. For example, if the upper and lower portions 16 and 18 of the package 10 are composed of a moldable plastic, then the carbon nanotubes 50 may be incorporated into the plastic source material prior to molding. Likewise, if the portions 16 and 18 are composed of polyimide, then the carbon nanotubes 50 may be incorporated into the polyimide monomer prior to pouring or setting. Similarly, if the portions 16 and 18 are to be fabricated from a ceramic, then the carbon nanotubes 50 may be incorporated into the powder(s) used to form the ceramic prior to furnacing.

The carbon nanotubes 50 themselves consist of at least one layer of graphite which is rolled up into a seamless tube. The carbon-carbon bonds that join the opposing seams of the tube may be parallel or non-parallel as desired. Furthermore, the tubes 50 may be achiral or chiral as desired. While the length and diameter of the carbon nanotubes 50 is largely a matter of design discretion, presently available tubes are provided with diameters and lengths in the range of a few microns. If the material in which the carbon nanotubes 50 will be incorporated should have electrically insulating properties, then the tubes 50 may be selected to have other than carbon-carbon bonds that are perpendicular to the tube axis, represented by the dashed line 52. As the skilled artisan will appreciate, the electrical conductivity of the tubes 50 is generally highest when the carbon-carbon bonds are indeed perpendicular to the tube axis 52. The concentration of the tubes 50 in any of the structures depicted in FIG. 2 is largely a matter of design discretion. It is anticipated that concentrations below about 10% by volume will produce an order of magnitude increase in the thermal conductivity of a given structure.

There will be excess carbon bonding sites available in the exterior of the tubes 50 that may be used to incorporate other chemical species to alter the electrical properties of the tubes 50. For example, it may be desirable to incorporate some halogen atoms into the tubes 50 to reduce their electrical conductivity. This may be desirable where the tubes 50 are incorporated into a structure that is designed to be electrically insulating, such as, for example, the upper and lower portions 16 and 18 of the package 10. Fluorine may be provide a desirable rate of reaction and establish a chemically inert surface.

The dispersal of the carbon nanotubes 50 in a given structure may be homogeneous of non-homogeneous as desired. Carbon nanotubes exhibit anisotropic thermal conductivity. The thermal conductivity is much higher along the tube axis 52 than along paths perpendicular thereto. Accordingly, and as described below, it may be possible to position the tubes 50 with their favored thermal conductivity axes aligned with a desired heat transfer pathway.

Figure 3:
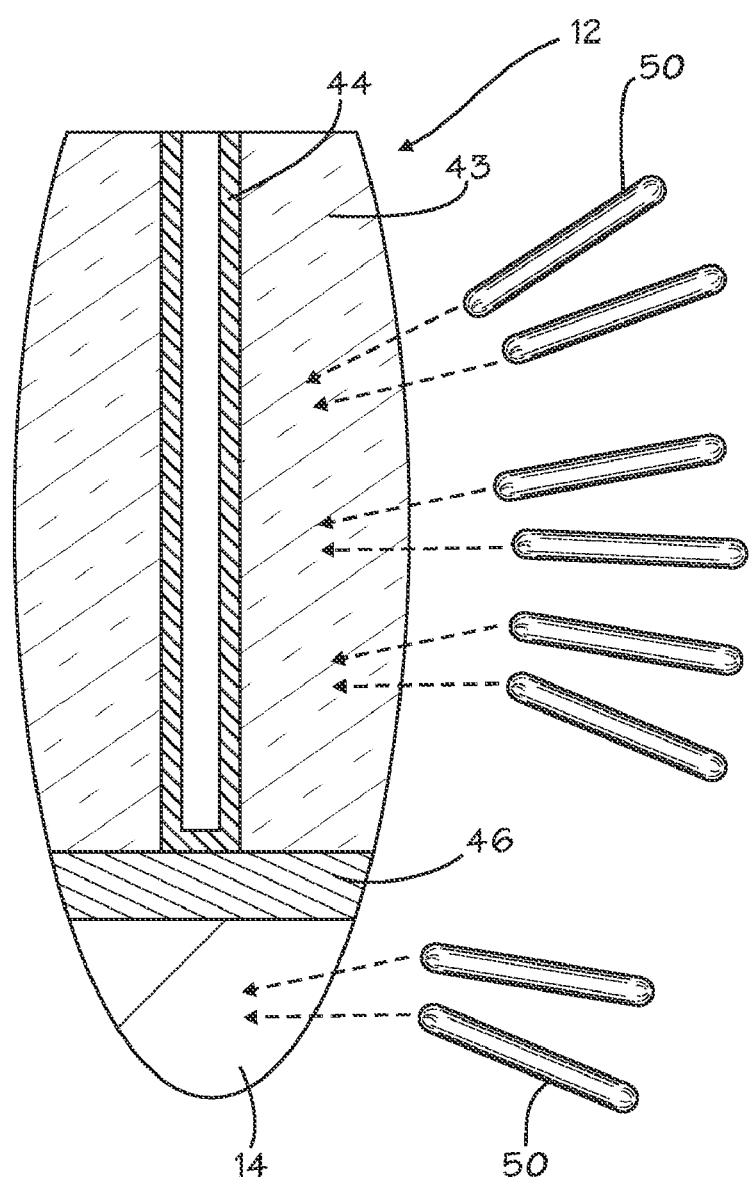
FIG. 3 is a magnified view of another selected portion of FIG. 1 that includes the socket member and circuit board in accordance with the present invention.

A more detailed view of the socket member 12 and the circuit board 14 may be understood by referring now to FIG. 3, which is a magnified view of the portion of FIG. 1 circumscribed generally by the dashed oval 49. Like the various structures of the package 10, the carbon nanotubes 50 may be incorporated into various structures of the socket 12 and the circuit board 14. For example, and as shown in FIG. 3, the carbon nanotubes 50 may be incorporated into the material forming the body 43 of the socket structure 12 and into the material of the circuit board 14 itself. The carbon nanotubes 50 may be incorporated into the body 43 of the socket structure 12 and the circuit board 14 as generally described above, namely, by dispersion of the carbon nanotubes 50 into the source material used to form the body 43 of the socket structure 12 and the circuit board 14. The electrically conducting socket 44 and the underlying conductor trace 46 will already exhibit relatively beneficial thermal conductivity. However, the incorporation of the carbon nanotubes 50 will greatly increase the thermal conductivity of the socket member 12 and the circuit board 14, and thus reduce the overall thermal resistance to heat flowing from the integrated circuit 20 depicted in FIG. 1.

Figure 4:
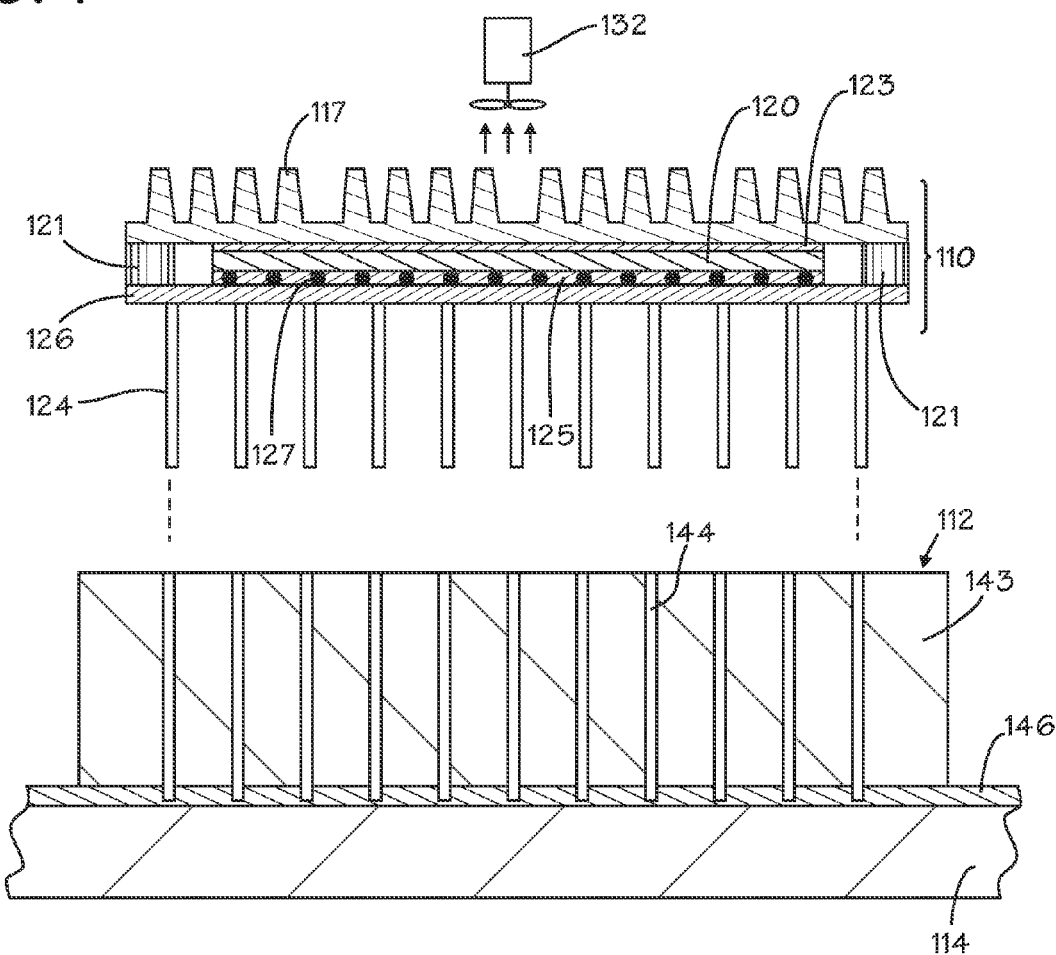
FIG. 4 is an exploded cross-sectional view of an alternate exemplary embodiment of an integrated circuit package in accordance with the present invention.

The skilled artisan will appreciate that the benefits of the present invention may be realized in a myriad of integrated circuit packaging and mounting schemes. Another exemplary embodiment is illustrated in FIG. 4, which is an exploded sectional view like FIG. 1, but depicts an alternate exemplary embodiment of an integrated circuit package 110, a socket structure 112 and a circuit board 114. This illustrative embodiment represents a so-called open package design, wherein the integrated circuit package 110 consists of a lower portion 116 but no upper enclosure. Instead, a heat sink structure 117 is positioned on the integrated circuit 120 and supported by a plurality of compliant support members 121 composed of rubber, plastic or the like. A thermal paste 123 is applied between the heat sink 117 and the integrated circuit 120 to provide a compliant, thermally conductive interface. The thermal paste 123 may be any of a variety of well-known materials used for thermal conduction interfaces, such as, well-known phase change materials or the like. The cooling function of the heat sink 117 may be augmented by a fan 132.

A plurality of conductor members 124 of the type described elsewhere herein is coupled to the lower portion 116. The integrated circuit 120 is positioned in a flip-chip orientation such that the lower side 125 thereof is seated on a plurality of collapsible solder bumps 127 that are, in-turn, interconnected with the conductors 124. The bumps 127 may be any of a variety of well-known bump interconnect structures, such as, for example, non-melting high temperature bump solder, completely melting bump solder, partially melting bump solder with copper core or the like. The space between the integrated circuit 120 and the lower section 116 of the package 110 is filled with a polymeric underfill material 131 that not only provides a cushion between the integrated circuit 120 and the lower portion 116 but also provides protection against thermal cracking that may result from thermal stresses created by the dissimilar thermal conductivities of the integrated circuit 120 and the lower portion 116.

The socket member 112, including a body 143 and a plurality of sockets 144, and the circuit board 114 including one or more conductors 146 may be configured as described elsewhere herein.

Figure 5:
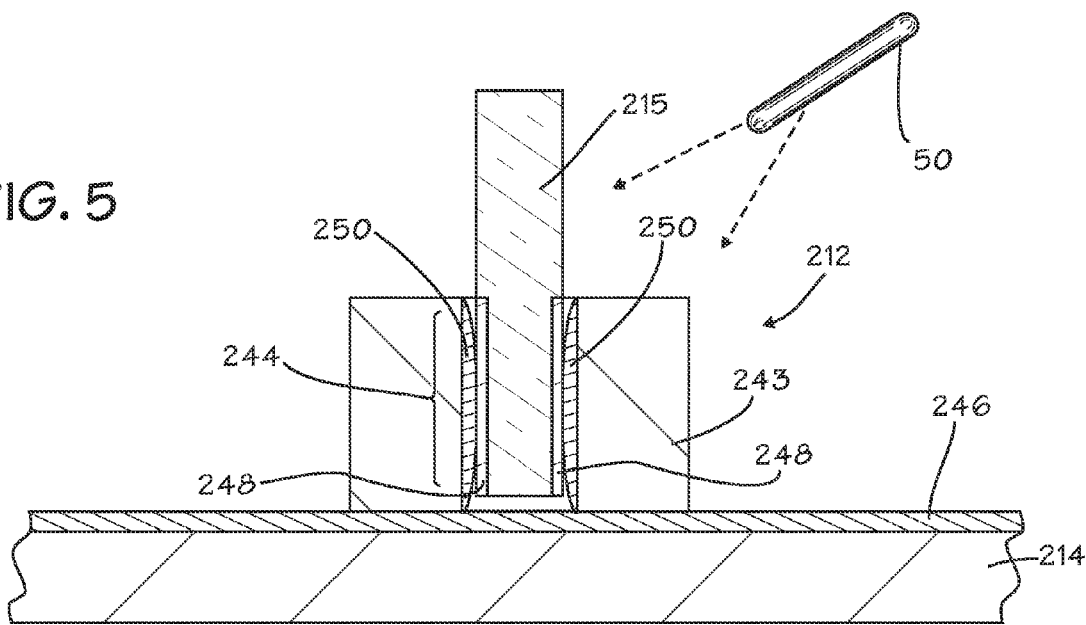
FIG. 5 is a cross-sectional view of an alternate exemplary embodiment of a socket member and a circuit board in accordance with the present invention.

As noted elsewhere herein, the benefits of the present invention do not depend upon a specific configuration of an interface, that is, package, socket, or board etc. Another alternate exemplary embodiment is illustrated in FIG. 5. A socket member 212 is mounted on a circuit board 214. The socket member 212 is adapted to receive another interface device 215, such as another board or integrated circuit package or other device. The socket member 212 includes a body 243 of the type described elsewhere herein. The body 243 is provided with one or more sockets 244. In this illustration, the interface device 215 is another circuit board that is provided with a plurality of conductor members or edge connectors 248. When inserted into the socket 244, the edge connectors 248 compliantly engage edge connectors 250 in the socket 244. The circuit board 214 may be configured and provided with one or more conductors 246 as described elsewhere herein.

To enhance the thermal conductivity of the overall system, the socket member 212, the circuit board 214 and the circuit board 215 may be provided with quantities of carbon nanotubes 50 as generally described elsewhere herein.

Figure 6:
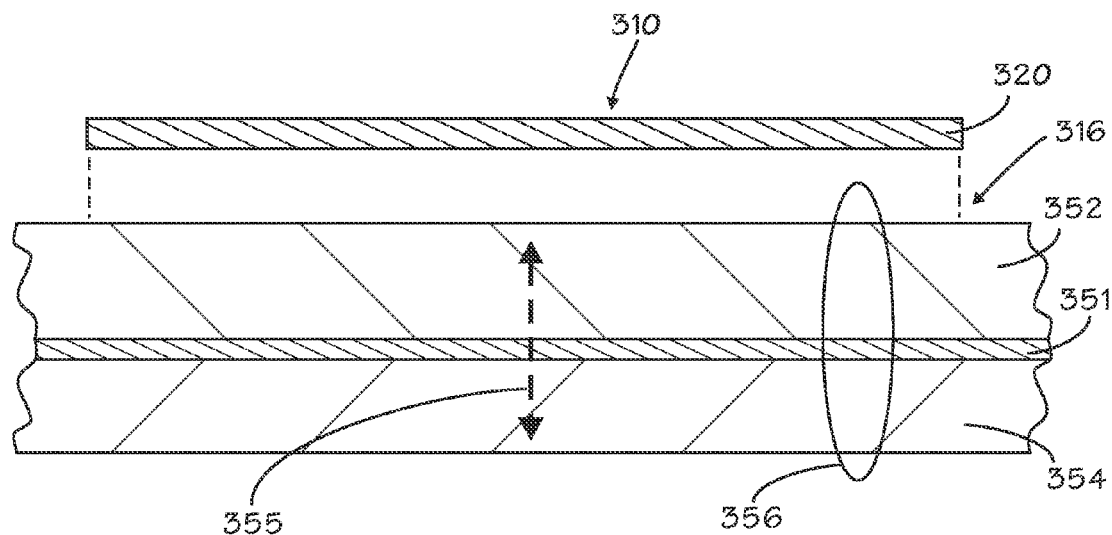
FIG. 6 is a cross-sectional view of another alternate exemplary embodiment of an integrated circuit interface device in accordance with the present invention.
Figure 7:
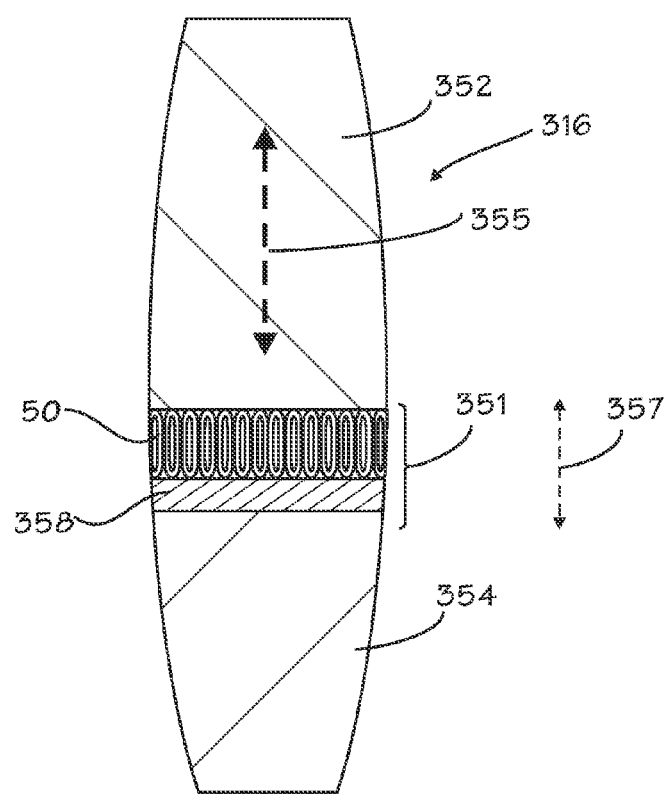
FIG. 7 is a magnified view of a selected portion of FIG. 6 that includes the integrated circuit interface device in accordance with the present invention.

Another alternate exemplary embodiment of an integrated circuit interface device is depicted in FIGS. 6 and 7. For the purposes of this illustration, the device is depicted as an integrated circuit package 310. However, the useful features may be incorporated into any of a myriad of interface structures. The package 310 includes a base or lower portion 316 from which an integrated circuit 320 is shown exploded. The base 316 includes a carbon nanotube layer 351 sandwiched between upper and lower insulating portions 352 and 354. The purpose of the carbon nanotube layer 351 is to provide a favored thermal conductivity pathway represented by the arrow 355. As shown in FIG. 7, which is a magnified view of the portion of FIG. 6 circumscribed by the dashed oval 356, the carbon nanotube layer 351 consists of a plurality of carbon nanotubes 50 positioned with their respective tube axes 357 in substantially parallel alignment with the favored heat transfer pathway 355. In this way, there is an effective amplification of conductive heat transfer along the pathway 355.

The upper and lower portions 352 and 354 may be composed of materials as described elsewhere herein. To form the carbon nanotube layer 351, a catalytic layer 358 of nickel, iron, cobalt or the like is deposited on the lower portion 354 using well-known techniques. Thereafter, the carbon nanotubes 50 are deposited by vapor deposition. The axial alignment of the tubes 50 may be enhanced by applying an electric field during the deposition as the tubes 50 will exhibit dipole behavior. Following application of the carbon nanotube layer 351, the upper portion 352 may be formed.

Figure 8:
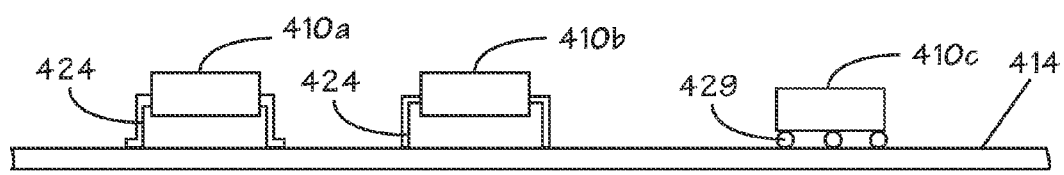
FIG. 8 is an edge view of another alternate exemplary embodiment of a circuit board in accordance with the present invention.

Whereas the foregoing illustrative embodiments generally involve so-called thru-hole mounting, virtually any mounting scheme may benefit from the present invention. For example, and as illustrated in FIG. 8, surface mounted packages 410a, 410b and 410c may be mounted on a circuit board 414. The package 410a is provided with gull-wing leads 424a. The package 410b is provided with butt leads 424b. However, the package 410c is soldered to the board 414 by means of solder balls 429. As with the other embodiments described elsewhere herein, carbon nanotubes may be incorporated into the packages 410a, 410b and 410c, and the board 414.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A circuit board, comprising:
   a substrate including a source material interspersed and in physical contact with a first plurality of unbundled carbon nanotubes; and
   at least one conductor coupled to the substrate.

2. The circuit board of claim 1, wherein the first plurality of carbon nanotubes comprises a first layer, each of the first plurality of carbon nanotubes comprising a tube axis, the tube axes being substantially aligned.

3. The circuit board of claim 1, comprising an integrated circuit coupled to the substrate.

4. The circuit board of claim 3, wherein the integrated circuit comprises a package.

5. The circuit board of claim 4, wherein at least a portion of the package comprises a second plurality of carbon nanotubes.

6. The circuit board of claim 5, wherein the second plurality of carbon nanotubes comprises a second layer, each of the second plurality of carbon nanotubes comprising a tube axis, the tube axes being substantially aligned.

7. The circuit board of claim 3, comprising a heat sink coupled to the package.

8. The circuit board of claim 1, comprising a socket member coupled to the substrate.

9. The circuit board of claim 8, wherein the socket member comprises a body having a third plurality of carbon nanotubes.

10. The circuit board of claim 9, wherein the third plurality of carbon nanotubes comprises a third layer, each of the third plurality of carbon nanotubes comprising a tube axis, the tube axes being substantially aligned.

11. The circuit board of claim 9, wherein the body comprises at least one socket.

12. The circuit board of claim 1, comprising a fan to direct air over the substrate.

13. A circuit board, comprising:
    a substrate including a source material interspersed and in physical contact with a first plurality of unbundled carbon nanotubes;
    at least one conductor coupled to the substrate;
    a socket member coupled to the substrate, the socket member including a body having a second plurality of carbon nanotubes; and
    another circuit board coupled to the socket member.

14. The circuit board of claim 13, wherein the first plurality of carbon nanotubes comprises a first layer, each of the first plurality of carbon nanotubes comprising a tube axis, the tube axes being substantially aligned.

15. The circuit board of claim 13, comprising an integrated circuit coupled to the substrate.

16. The circuit board of claim 15, wherein the integrated circuit comprises a package.

17. The circuit board of claim 16, wherein at least a portion of the package comprises a third plurality of carbon nanotubes.

* * * * *